United States Patent
Furuyama

(10) Patent No.: US 9,616,618 B2
(45) Date of Patent: Apr. 11, 2017

(54) VENT STRUCTURE AND METHOD OF MANUFACTURING THE SAME

(75) Inventor: Satoru Furuyama, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 772 days.

(21) Appl. No.: 12/718,461

(22) Filed: Mar. 5, 2010

(65) Prior Publication Data

US 2010/0227543 A1 Sep. 9, 2010

(30) Foreign Application Priority Data

Dec. 11, 2008 (JP) .................................. 2008-315399

(51) Int. Cl.
*B60H 1/00* (2006.01)
*B29C 65/00* (2006.01)
(Continued)

(52) U.S. Cl.
CPC ........ *B29C 66/232* (2013.01); *B29C 65/1635* (2013.01); *B29C 66/53247* (2013.01); *B29C 66/53461* (2013.01); *B29C 66/712* (2013.01); *B29C 66/723* (2013.01); *B29C 66/727* (2013.01); *B29C 66/73115* (2013.01); *B29C 66/73116* (2013.01); *B29C 66/81267* (2013.01); *B29C 65/1606* (2013.01); *B29C 65/1616* (2013.01); *B29C 65/1619* (2013.01); *B29C 65/1664* (2013.01); *B29C 65/1677* (2013.01); *B29C 65/82* (2013.01); *B29C 65/8246* (2013.01); *B29C 66/54* (2013.01); *B29C 66/71* (2013.01); *B29C 66/7212* (2013.01); *B29C 66/73921* (2013.01); *B29C 66/8122* (2013.01); *B29C 66/8322* (2013.01);
(Continued)

(58) Field of Classification Search
CPC ....................................................... B01D 19/00
USPC .......................................................... 454/270
See application file for complete search history.

(56) References Cited

U.S. PATENT DOCUMENTS 5,421,909 A * 6/1995 Ishikawa ........... H01L 31/02167
136/256
5,782,994 A * 7/1998 Mori ................. H01L 31/02167
136/251
(Continued)

FOREIGN PATENT DOCUMENTS

JP   2003-123506    4/2003
JP   2003-318557    11/2003
(Continued)

*Primary Examiner* — Steven B McAllister
*Assistant Examiner* — Samantha Miller
(74) *Attorney, Agent, or Firm* — Hamre, Schumann, Mueller & Larson, P.C.

(57) ABSTRACT

A vent structure includes: a first housing component having an opening portion for ventilation; a gas-permeable membrane that is attached to the first housing component to close the opening portion; and a laser welding portion that joins the first housing component with the gas-permeable membrane. The gas-permeable membrane includes a main body including a fluororesin film and a porous resin sheet that is laid on the main body. The porous resin sheet is located on the surface side of the vent structure. Both of the main body and the outer peripheral portion of the porous resin sheet that projects outwardly from the main body are fixed to the first housing component by the laser welding portion.

18 Claims, 8 Drawing Sheets

(51) Int. Cl.

| | |
|---|---|
| B29C 65/16 | (2006.01) |
| B29C 65/82 | (2006.01) |
| B29K 7/00 | (2006.01) |
| B29K 9/06 | (2006.01) |
| B29K 21/00 | (2006.01) |
| B29K 23/00 | (2006.01) |
| B29K 27/12 | (2006.01) |
| B29K 27/18 | (2006.01) |
| B29K 55/02 | (2006.01) |
| B29K 67/00 | (2006.01) |
| B29K 77/00 | (2006.01) |
| B29K 81/00 | (2006.01) |
| B29K 101/12 | (2006.01) |
| B29K 105/00 | (2006.01) |
| B29K 105/04 | (2006.01) |
| B29K 105/06 | (2006.01) |
| B29K 105/08 | (2006.01) |
| B29K 105/20 | (2006.01) |
| B29K 309/08 | (2006.01) |
| B29L 9/00 | (2006.01) |
| B29L 15/00 | (2006.01) |
| B29L 31/34 | (2006.01) |
| B29L 31/42 | (2006.01) |
| B29L 31/00 | (2006.01) |
| F21V 31/03 | (2006.01) |
| F21S 8/10 | (2006.01) |

(52) U.S. Cl.
CPC ...... *B29K 2007/00* (2013.01); *B29K 2009/06* (2013.01); *B29K 2011/00* (2013.01); *B29K 2021/00* (2013.01); *B29K 2023/06* (2013.01); *B29K 2023/0683* (2013.01); *B29K 2023/12* (2013.01); *B29K 2027/12* (2013.01); *B29K 2027/18* (2013.01); *B29K 2055/02* (2013.01); *B29K 2067/00* (2013.01); *B29K 2067/006* (2013.01); *B29K 2077/10* (2013.01); *B29K 2081/04* (2013.01); *B29K 2081/06* (2013.01); *B29K 2101/12* (2013.01); *B29K 2105/0032* (2013.01); *B29K 2105/04* (2013.01); *B29K 2105/06* (2013.01); *B29K 2105/0845* (2013.01); *B29K 2105/0854* (2013.01); *B29K 2105/206* (2013.01); *B29K 2309/08* (2013.01); *B29K 2909/08* (2013.01); *B29K 2995/0026* (2013.01); *B29K 2995/0029* (2013.01); *B29K 2995/0065* (2013.01); *B29L 2009/00* (2013.01); *B29L 2015/003* (2013.01); *B29L 2031/3443* (2013.01); *B29L 2031/425* (2013.01); *B29L 2031/747* (2013.01); *B29L 2031/749* (2013.01); *F21S 48/332* (2013.01); *F21V 31/03* (2013.01)

(56) References Cited

U.S. PATENT DOCUMENTS

| | | | |
|---|---|---|---|
| 6,140,570 A * | 10/2000 | Kariya | H01L 31/022466 136/246 |
| 6,521,024 B1 * | 2/2003 | Akahori et al. | 96/4 |
| 6,994,621 B2 | 2/2006 | Mashiko et al. | |
| 7,556,878 B2 * | 7/2009 | Ibuka et al. | 429/514 |
| 2001/0007306 A1 * | 7/2001 | Ichinose | C25F 3/02 205/666 |
| 2003/0216119 A1 * | 11/2003 | Mashiko | F21S 48/335 454/275 |
| 2004/0170857 A1 * | 9/2004 | Yoshihara | C25D 5/10 428/553 |
| 2005/0041774 A1 * | 2/2005 | Saitoh | B01D 46/0002 378/53 |
| 2010/0227544 A1 * | 9/2010 | Furuyama et al. | 454/339 |

FOREIGN PATENT DOCUMENTS

| | | | |
|---|---|---|---|
| JP | 2004-047425 A | 2/2004 | |
| JP | 2007-186189 | 7/2007 | |
| JP | 2008-055981 | 3/2008 | |
| WO | WO 2007069387 A1 * | 6/2007 | F21V 31/03 |

* cited by examiner

VENT STRUCTURE AND METHOD OF MANUFACTURING THE SAME

BACKGROUND OF THE INVENTION

1. Field of the Invention

The present invention relates to a vent structure and a method of manufacturing the vent structure.

2. Description of Related Art

A vent member is installed in a housing for accommodating electrical components of an automobile, such as lamps, sensors, and an ECU. Such a vent member is intended to ensure the ventilation between the interior and the exterior of the housing and to block the entry of foreign substances into the housing. An example of such a vent member is disclosed in JP 2004-47425 A.

A vent member disclosed in JP 2004-47425 A includes a supporting body 103, a gas-permeable membrane 102 disposed on the supporting member 103, and a protecting portion 104 fitted in the supporting member 103 to cover the gas-permeable membrane 102, as shown in FIG. 11. Such a vent member 101 is fixed to an opening portion 107 of a housing 106 with an O-ring 105. A gas passes through the gas-permeable membrane 102, which ensures the ventilation between the interior and the exterior of the housing 106. The protecting portion 104 prevents the gas-permeable membrane 102 from being damaged by external force (for example, a water jet used for car washing) or from having decreased gas permeability due to the accumulation of dust.

SUMMARY OF THE INVENTION

In the conventional vent member shown in FIG. 11, the gas-permeable membrane 102 is fixed to the supporting member 103 typically by heat welding or ultrasonic welding. A welding horn has to be in contact with the gas-permeable membrane 102 to perform heat welding or ultrasonic welding. Therefore, the gas-permeable membrane 102 may be damaged unexpectedly by the horn. If the horn is contaminated, defects such as insufficient welding could occur. In addition, the design of the vent member has to be taken into consideration to facilitate the welding process. For example, in the vent member shown in FIG. 11, the protecting portion 104 and the supporting member 103 are separate components.

Furthermore, with a recent trend toward miniaturization of various types of products, vent members have been reduced in height. An easy way to reduce the height of the vent member shown in FIG. 11 is to omit the protecting portion 104, but if the protecting portion 104 is omitted, the gas-permeable membrane 102 is damaged and its gas permeability is more likely to be impaired.

In view of these circumstances, an object of the present invention is to provide a vent structure having both durability and gas permeability.

The present invention provides a vent structure including: a resin component having an opening portion for ventilation; a gas-permeable membrane that is attached to the resin component to close the opening portion, the gas-permeable membrane having: a main body including a fluororesin film; and a porous resin sheet that is laid on the main body; and a laser welding portion that is formed around the opening portion to lie between the resin component and the gas-permeable membrane and that joins the resin component with the gas-permeable membrane. In this vent structure, the porous resin sheet is located on a surface side of the vent structure, and both of the main body and an outer peripheral portion of the porous resin sheet that projects outwardly from the main body are fixed to the resin component by the laser welding portion.

In another aspect, the present invention provides a method of manufacturing a vent structure including: a resin component having an opening portion for ventilation; and a gas-permeable membrane that is attached to the resin component to close the opening portion, wherein the gas-permeable membrane has: a main body including a fluororesin film; and a porous resin sheet that is laid on the main body. This method includes the steps of placing the gas-permeable membrane on the opening portion of the resin component so that the porous resin sheet is located on a surface side of the vent structure to be manufactured; and irradiating an interface between the resin component and the gas-permeable membrane with a laser beam so that a laser welding portion is formed around the opening portion to fix, to the resin component, both of the main body and an outer peripheral portion of the porous resin sheet that projects outwardly from the main body.

According to the vent structure of the present invention, the resin component and the gas-permeable membrane are joined together by the laser welding portion. Therefore, the gas-permeable membrane is less likely to be damaged in the welding step. Since the porous resin sheet is located on the surface side of the vent structure, the main body including the fluororesin film can be protected with the porous resin sheet. The gas-permeable membrane used in the present invention is a combination of the fluororesin film and the porous resin sheet. Therefore, even if the water resistance of the porous resin sheet is low, the fluororesin film can ensure the water resistance required for the gas-permeable membrane. In addition, since both of the main body and the outer peripheral portion of the porous resin sheet are fixed to the resin component by the laser welding portion, they are not detached easily from the opening portion of the resin component. As described above, the present invention can provide a vent structure having high gas permeability, water resistance and durability (pressure resistance).

According to the manufacturing method of the present invention, since the gas-permeable membrane and the resin component are joined together by laser welding, which is a non-contact welding technique, damage to the gas-permeable membrane can be reduced. It is thus possible to manufacture easily a vent structure capable of maintaining high gas permeability, water resistance and durability for a long period of time.

DETAILED DESCRIPTION OF THE INVENTION

First Embodiment

Figure 1:
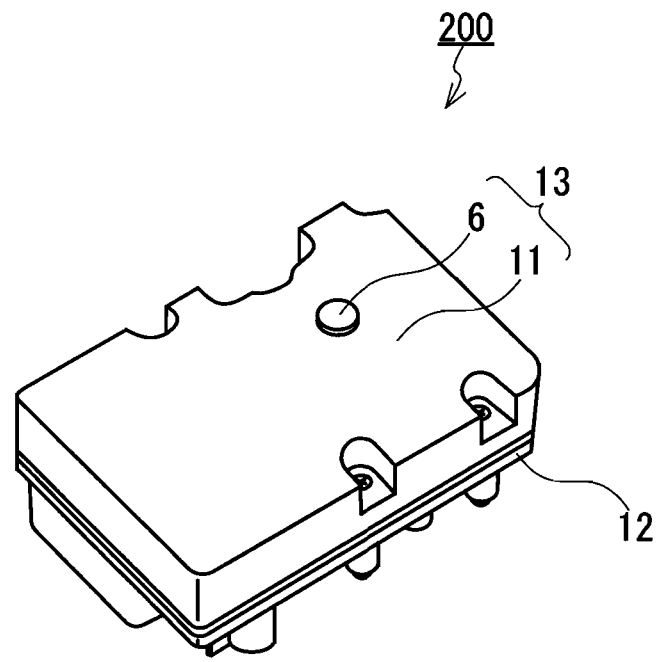
FIG. 1 is a perspective view of an entire housing having a vent structure according to the first embodiment of the present invention.
Figure 2:
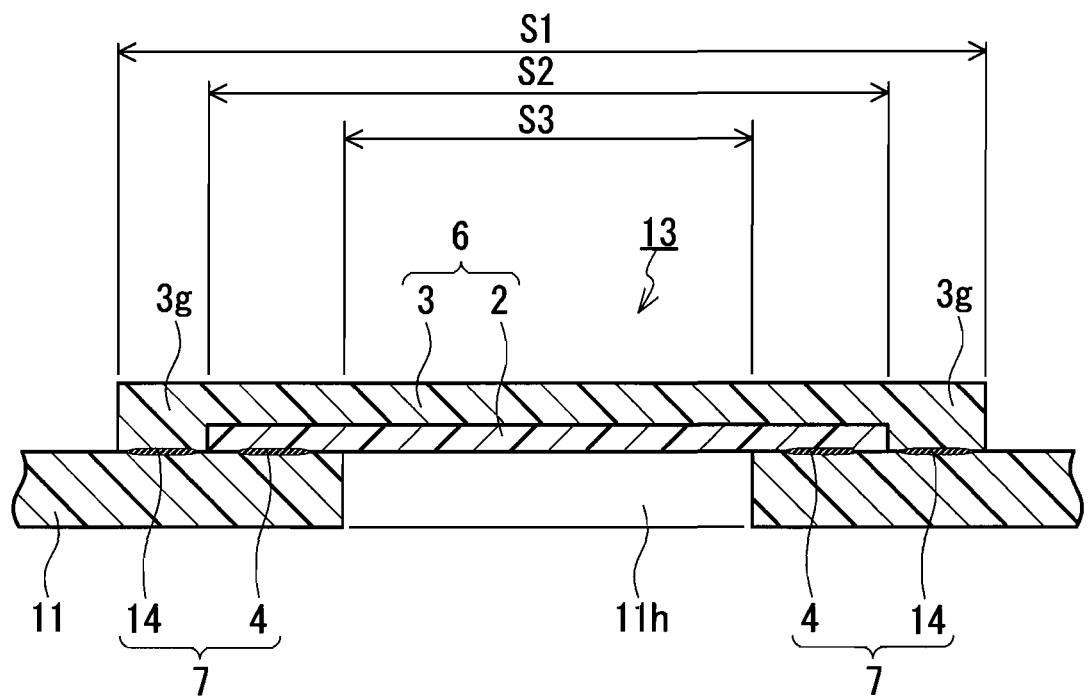
FIG. 2 is a cross-sectional view of the vent structure shown in FIG. 1.

FIG. 1 is a perspective view of an entire housing having a vent structure according to an embodiment of the present invention. FIG. 2 is a cross-sectional view of the vent structure shown in FIG. 1. As shown in FIG. 1, a housing 200 includes a gas-permeable membrane 6, a first housing component 11 (an upper part of the housing), and a second housing component 12 (a bottom part of the housing). A vent structure 13 is formed of the gas-permeable membrane 6 and the first housing component 11. The gas-permeable membrane 6 allows air and water vapor to come in and go out of the housing 200, while preventing foreign substances such as liquid and dust from entering the housing 200. These functions of the gas-permeable membrane 6 allow the atmosphere inside the housing 200 and the atmosphere outside the housing 200 to be kept in the same state, without allowing foreign substances to enter the housing 200.

As shown in FIG. 2, the vent structure 13 has the gas-permeable membrane 6, the first housing component 11 to which the gas-permeable membrane 6 is attached, and a laser welding portion 7 that joins the gas-permeable membrane 6 with the first housing component 11. The first housing component 11 serves as a supporting body for supporting the gas-permeable membrane 6. The first housing component 11 has an opening portion 11h for ventilation between the interior and the exterior of the housing 200 (FIG. 1). The gas-permeable membrane 6 is attached to the first housing component 11 to close the opening portion 11h. The laser welding portion 7 has a ring shape in a plan view, and is formed around the opening portion 11h to lie between the first housing component 11 and the gas-permeable membrane 6.

The gas-permeable membrane 6 has a main body 2 including a fluororesin film and a porous resin sheet 3 that is laid on the main body 2. In the present embodiment, the porous resin sheet 3 is provided on only one side of the main body 2. The gas-permeable membrane 6 is fixed to the first housing component 11 so that the porous resin sheet 3 is located on the surface side of the vent structure 13 (on the side farther away from the first housing part 11) and the first housing component 11 and the main body 2 are in contact with each other. That is, the main body 2 is covered with the porous resin sheet 3. The gas-permeable membrane 6 typically has a circular shape, but it may have another shape such as a square as long as it can close the opening portion 11h.

In the present embodiment, the porous resin sheet 3 has an outer peripheral portion 3g that projects outwardly in the in-plane direction from the main body 2. The outer edge of the main body 2 is covered with the outer peripheral portion 3g of the porous resin sheet 3. More specifically, the area S1 of the porous resin sheet 3, the area S2 of the main body 2, and the opening area S3 of the opening portion 11h satisfy the relationship of S1>S2>S3, and the main body 2 is fitted entirely in the porous resin sheet 3 in a plan view. That is, in the present embodiment, the main body 2 is covered completely with the porous resin sheet 3. Both of the outer peripheral portion 3g of the porous resin sheet 3 and the main body 2 are fixed to the first housing component 11 by the laser welding portion 7. With such a configuration, the main body 2 can be protected reliably with the porous resin sheet 3.

The laser welding portion 7 includes an inner periphery welding portion 4 that is formed between the first housing component 11 and the main body 2 and an outer periphery welding portion 14 that is formed between the first housing component 11 and the outer peripheral portion 3g of the porous resin sheet 3. Both of the inner periphery welding portion 4 and the outer periphery welding portion 14 have a ring shape in a plan view. That is, the laser welding portion 7 has a double-ring shape (typically a double-circle shape) in a plan view. The laser welding portion 7 configured as described above achieves the high-strength joint between the gas-permeable membrane 6 and the first housing component 11 and also achieves the high durability of the vent structure 13 against pressure applied in the in-plane direction. Even if a defect such as peeling occurs in one of the inner periphery welding portion 4 and the outer periphery welding portion 14, the other welding portion can counteract the defect. Therefore, the reliability of the vent structure 13 also is enhanced.

In the gas-permeable membrane 6, the main body 2 and the porous resin sheet 3 may be integrated together, but need not be integrated. This is because the laser welding portion 7 fixes the main body 2 and the porous resin sheet 3 individually to the first housing component 11. That is, the present embodiment provides a high degree of flexibility in the manufacturing procedure. The main body 2 and the porous resin sheet 3 can be integrated together by a known technique such as heat lamination.

Figure 3:
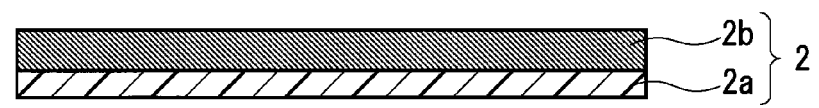
FIG. 3 is a cross-sectional view of a main body of a gas-permeable membrane.

As shown in FIG. 3, the main body 2 of the gas-permeable membrane 6 has a fluororesin film 2a and a reinforcing member 2b provided on one side of the fluororesin film 2a. In the case where the reinforcing member 2b is located closer to (in contact with) the first housing component 11, the reinforcing member 2b is laser-welded to the first housing component 11. Therefore, damage caused by the welding is prevented from affecting the fluororesin film 2a. The reinforcing member 2b may be provided on both sides of the fluororesin film 2a, or may be omitted. In the case where the reinforcing member 2b is omitted, the fluororesin film 2a is laser-welded directly to the first housing component 11.

The fluororesin film 2a is a film having gas permeability, and typically is a porous membrane. Examples of the fluororesin that can be used for the fluororesin film 2a include polytetrafluoroethylene (PTFE), polychlorotrifluoroethylene, a copolymer of tetrafluoroethylene and hexafluoropropylene, and a copolymer of tetrafluoroethylene and ethylene. Among them, the most preferable is PTFE because it can ensure high gas permeability with a small area and has a high ability to block the entry of foreign substances into the housing 200. A porous PTFE membrane can be produced by a known formation technique such as stretching or extraction. The fluororesin film 2a may be subjected to oil repellent treatment or water repellent treatment.

The reinforcing member 2b is a member made of a resin such as polyester, polyethylene, polypropylene, or aramid. The presence of the reinforcing member 2b facilitates the handling of the fluororesin film 2a. The configuration of the reinforcing member 2b is not particularly limited as long as it can maintain the gas permeability of the gas-permeable membrane 6. Examples of the reinforcing member 2b include woven fabrics, nonwoven fabrics, nets, and meshes. Typically, it is a nonwoven fabric.

The fluororesin film 2a and the reinforcing member 2b may be laminated by heat lamination, or may be laminated using an adhesive. Preferably, the fluororesin film 2a and the reinforcing member 2b are laminated via a welding portion or a bonding portion that is dispersed uniformly in the plane. When the welding portion or the bonding portion covers, for example, 5 to 20% of the entire area, water resistance is less likely to decrease to an insufficient level or peeling is less likely to occur.

In view of the strength of the main body 2 and the easier fixing of it to the first housing component 11, the thickness of the main body 2 may be in a range of 0.02 to 1.0 mm (or 0.05 to 0.2 mm). The gas permeability of the main body 2 may be in a range of 0.1 to 500 sec/100 cm$^3$ in terms of a Gurley number measured by a Gurley tester according to JIS P8117. The water entry pressure may be at least 1.0 kPa.

Figure 11:
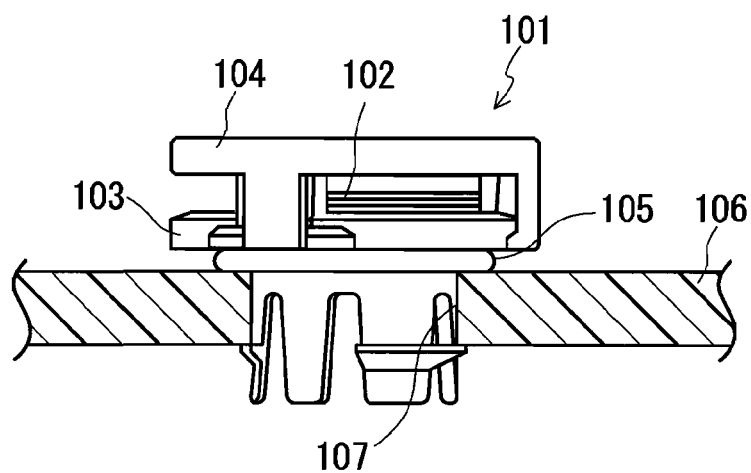
FIG. 11 is a side view of a conventional vent member.

As described with reference to FIG. 11, the conventional vent member is provided with a member for protecting the gas-permeable membrane in order to prevent the gas-permeable membrane from being damaged due to a direct impact from foreign substances such as water droplets. In contrast, in the present embodiment, the main body 2 is protected with the porous resin sheet 3. Therefore, even if the gas-permeable membrane 6 is not covered with another member, the gas-permeable membrane 6 is less likely to be damaged. The omission of the other member for covering the gas-permeable membrane 6 allows a reduction in the number of components and a reduction in the height of the vent structure. In the vent structure 13 shown in FIG. 2, a member for covering the gas-permeable membrane 6 may be provided, of course. In order to avoid having the gas-permeable membrane 6 project from the surface of the first housing component 11, a shallow recess may be formed in the first housing component 11 so that the opening portion 11h is formed in the recess.

The porous resin sheet 3 is a sheet composed of a different type of resin from the resin of the fluororesin film 2a. The porous resin sheet 3 may be made of a resin having a lower melting point than the fluororesin that constitutes the fluororesin film 2a. This is because the main body 2 and the porous resin sheet 3 can be integrated together easily by heat lamination. The thickness of the porous resin sheet 3 is not particularly limited, but it may be in a range of 0.02 to 3.0 mm (or 0.05 to 1.0 mm). In terms of ensuring sufficient strength, it is better that the thickness of the porous resin sheet 3 is greater than that of the main body 2. The porous resin sheet 3 further is required to have high gas permeability. An example of the porous resin sheet 3 that can meet such requirements is an ultra-high molecular weight polyethylene porous sheet.

As stated herein, "ultra-high molecular weight polyethylene" is polyethylene having an average molecular weight of at least 500,000. The average molecular weight of ultra-high molecular weight polyethylene usually is in a range of 2,000,000 to 10,000,000. The average molecular weight can be measured by, for example, a method (viscosity method) according to ASTM D4020. Hereinafter, ultra-high molecular weight polyethylene is referred to as "UHMWPE" for abbreviation.

A UHMWPE porous sheet as the porous resin sheet 3 can be produced from a sintered compact of UHMWPE powder. The sintered compact of UHMWPE powder can be obtained by sintering UHMWPE powder (with an average particle diameter of 30 to 200 μm) filled in a mold at around a melting point of UHMWPE (for example, 130 to 160° C.). The resulting sintered compact usually is in a block form. A UHMWPE porous sheet is obtained by cutting the block of the sintered compact into a sheet form. The UHMWPE porous sheet obtained by this production method (powder sintering method) has a porosity of 20 to 50%.

The UHMWPE porous sheet produced from the sintered compact of UHMWPE powder not only has excellent properties of UHMWPE such as chemical resistance, abrasion resistance, and releasability, but also is imparted with additional properties such as gas permeability, cushioning properties, and slidability because of its porous structure. In the present embodiment, the position of the gas-permeable membrane 6 with respect to the first housing component 11 is determined so that the porous resin sheet 3 is located on the surface side of the vent structure 13 (more specifically, so that the porous resin sheet 3 is exposed on the surface). Therefore, the excellent chemical resistance of the porous resin sheet 3 is favorable for the vent structure 13 of the present embodiment. The high slidability of the porous resin sheet 3 reduces the adhesion of foreign substances to the gas-permeable membrane 6.

In addition, the UHMWPE porous sheet is harder and has higher strength than a polyethylene nonwoven fabric that is a commonly used reinforcing material. Compared with a polyethylene nonwoven fabric having the same strength, the porous UHMWPE sheet is incomparably thinner and has higher gas permeability. In the case where a cover for protecting the gas-permeable membrane 6 is not provided, since the gas-permeable membrane 6 is exposed directly to the outside atmosphere (for example, an engine room of an automobile), the gas-permeable membrane 6 itself is required to have sufficient physical strength. In order to obtain sufficient strength in a conventional reinforcing material such as a polyethylene nonwoven fabric, a considerable thickness is necessary, which may sacrifice the gas permeability. In contrast, the UHMWPE porous sheet has an advantage that it can achieve a high level of strength and gas permeability at the same time.

In the case where the UHMWPE porous sheet is used as the porous resin sheet 3, a welding structure as shown in FIG. 2 is highly effective. This is because it is relatively difficult to determine the heating conditions and pressing conditions for the heat lamination of the UHMWPE porous sheet and the main body 2. When a relatively thick UHMWPE porous sheet is used in view of strength, heat tends not to be transferred between the UHMWPE porous sheet and the main body 2, which may cause incomplete lamination. On the other hand, excessive heat and pressure should not be applied because they damage the UHMWPE porous sheet and the main body 2. In the present embodiment, since the heat lamination of the main body 2 and the porous resin sheet 3 can be omitted, such problems can be eliminated. In the case where the heat lamination of the main body 2 and the porous resin sheet 3 is omitted, the porous resin sheet 3 merely is laid on the main body 2 at least in a region facing the opening portion 11h. Therefore, in this region, the intrinsic properties of the main body 2 and the porous resin sheet 3, such as gas permeability, water resistance, and durability, can be exhibited without being affected by heat lamination.

Next, the first housing component 11 and the second housing component 12 are resin components that constitute the housing 200, and are made of a resin having a lower melting point than the fluororesin that constitutes the fluororesin film 2a (FIG. 3) to form the laser welding portion 7. Specific examples of the material for the housing components 11 and 12 include thermoplastic resins and elastomers.

Examples of the thermoplastic resins include PBT (polybutylene terephthalate), PET (polyethylene terephthalate), PPS (polyphenylene terephthalate), PSU (polysulfone), PP (polypropylene), PE (polyethylene), and ABS (acrylonitrile-butadiene-styrene copolymer). Examples of the elastomers include chloroprene rubber, isoprene rubber, styrene-butadiene rubber, and rubber compositions containing natural rubber as a main component. The housing components 11 and 12 can be produced using these resins by a known molding technique such as injection molding.

The housing components 11 and 12 further may contain materials such as a pigment, a reinforcing filler, and other additives. Specific examples of the pigment include carbon black and titanium white. Specific examples of the reinforcing filler include glass particles and glass fibers. Specific examples of the other additives include a water-repellent agent and an insulating material. When the first housing component 11 has a dark color such as black or dark brown, it absorbs laser light well, and the laser welding portion 7 can be formed in a short time. Therefore, the first housing component 11 preferably contains a pigment such as carbon black. On the other hand, it is desirable that the color of the gas-permeable membrane 6 (specifically, the color of the fluororesin film 2a and the color of the porous resin sheet 3) be a color that is relatively hard to absorb laser light with a predetermined wavelength, for example, white, translucent, or transparent. Typically, the gas-permeable membrane 6 does not contain a black pigment such as carbon black.

Next, a method of manufacturing the vent structure shown in FIG. 2 will be described with reference to FIGS. 4A to 4C.

Figure 4A:
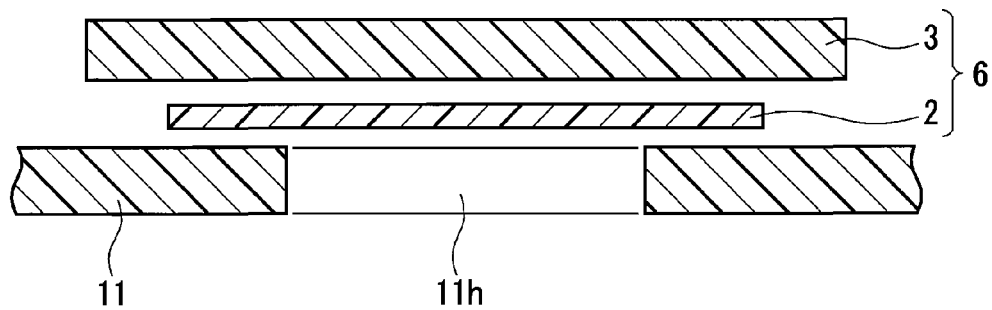
FIGS. 4A to 4C are diagrams showing a manufacturing procedure of the vent structure shown in FIG. 2.

As shown in FIG. 4A, first, the gas-permeable membrane 6 and the first housing component 11 are prepared, and the gas-permeable membrane 6 is placed on the opening portion 11h of the first housing component 11. The first housing component 11 and the gas-permeable membrane 6 are positioned so that the opening portion 11h of the first housing component 11 is closed by the gas-permeable membrane 6. More specifically, the gas-permeable membrane 6 is placed on the opening portion 11h of the first housing component 11 so that the porous resin sheet 3 is located on the surface side of the vent structure 13 (or the housing 200) to be manufactured. With such a configuration, since the main body 2 is sandwiched between the first housing component 11 and the porous resin sheet 3, the main body 2 can be protected reliably with the porous resin sheet 3.

In the gas-permeable membrane 6, the main body 2 and the porous resin sheet 3 may be laminated previously by heat lamination, but they need not be laminated, as shown in the diagram. In the case where the main body 2 and the porous resin sheet 3 are laminated previously, the gas-permeable membrane 6 can be handled easily. In the case where they are not laminated previously, the number of steps is reduced, and thus an increase in the productivity can be expected. In addition, since the main body 2 and the porous resin sheet 3 are prevented from being damaged by heat lamination, the intrinsic performance of the main body 2 and the porous resin sheet 3 can be reflected in the gas-permeable membrane 6.

Figure 4B:
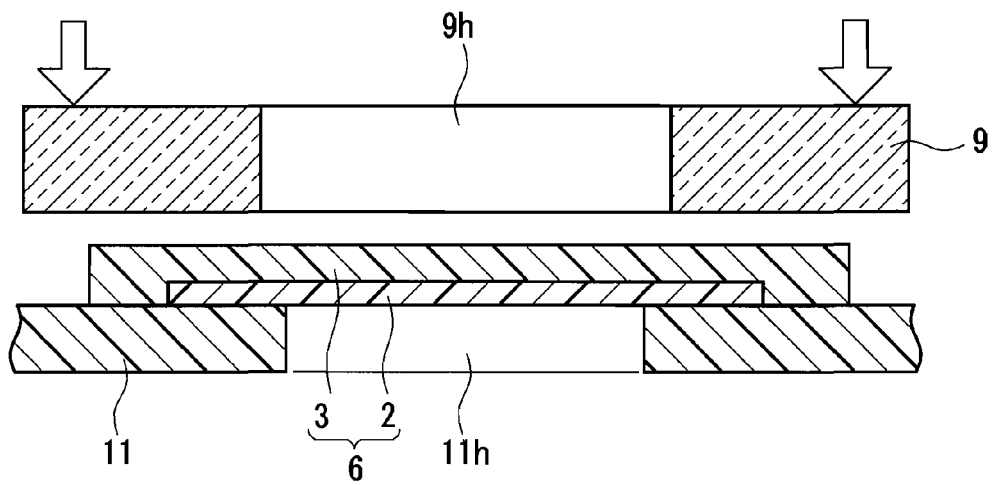

As shown in FIG. 4B, a light-transmissive jig 9 having an opening portion 9h for heat radiation preferably is used as a jig for maintaining the positional relationship between the gas-permeable membrane 6 and the first housing component 11. The gas-permeable membrane 6 is sandwiched between the light-transmissive jig 9 and the first housing component 11 so that the gas-permeable membrane 6 is exposed through the opening portion 9h. A specific example of the light-transmissive jig 9 is a glass plate having a flat surface as a surface that is to be brought into contact with the gas-permeable membrane 6. The use of this light-transmissive jig 9 prevents the gas-permeable membrane 6 from being damaged.

The gas-permeable membrane 6 is pressed firmly with the light-transmissive jig 9 so that the gas-permeable membrane 6 and the first housing component 11 are in close contact with each other. For example, the gas-permeable membrane 6 is pressed so that a pressure of 0.01 to 10 MPa (or 0.1 to 5.0 MPa) is applied to the gas-permeable membrane 6 (specifically, a region to be irradiated with a laser beam), although this may vary depending on the dimensions of the gas-permeable membrane 6. When laser welding is carried out while applying a suitable pressure, the gas-permeable membrane 6 and the first housing component 11 can be joined together firmly. Care should be taken for the upper limit of the pressure applied in order to avoid a decrease in the gas permeability.

Figure 4C:
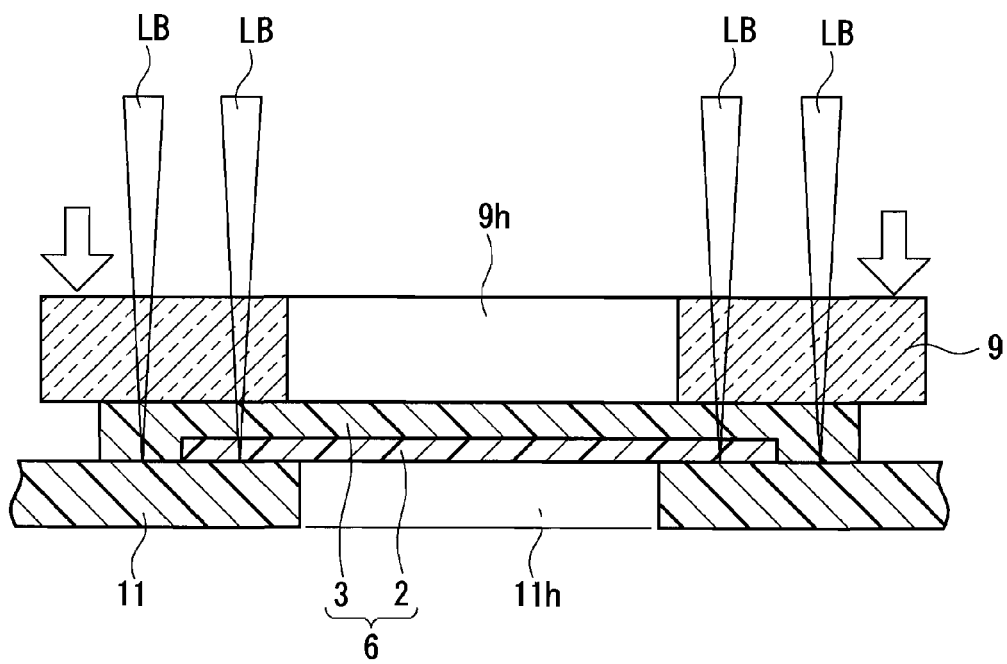

Next, as shown in FIG. 4C, the interface between the gas permeability 6 and the first housing component 11 is irradiated with a laser beam LB so that the laser welding portion 7 (see FIG. 2) is formed around the opening portion 11h to fix, to the first housing component 11, both of the main body 2 and the outer peripheral portion of the porous resin sheet that projects outwardly from the main body 2. In this laser irradiating step, the gas-permeable membrane 6 and the first housing component 11 are irradiated with the laser beam via the light-transmissive jig 9. Since the opening portion 9h for heat radiation is formed in the light-transmissive jig 9, excess heat can be dissipated through this opening portion 9h. As a result, a required minimum size of the laser welding portion 7 can be formed, and the gas-permeable membrane 6 can be prevented from being damaged.

In the laser irradiating step, the area irradiated with the laser beam LB is controlled so that the laser welding portion 7 is formed 360 degrees around the opening portion 11h of the first housing component 11. As a result, the vent structure shown in FIG. 2 can be manufactured.

In the laser irradiating step, a first irradiating step for forming the inner periphery welding portion 4 of the laser welding portion 7 between the first housing component 11 and the main body 2 is carried out. Furthermore, a second irradiating step for forming the outer periphery welding portion 14 of the laser welding portion 7 between the first housing component 11 and the outer peripheral portion 3g of the porous resin sheet 3 is carried out. Thus, the vent structure shown in FIG. 2 is obtained. The order of the first irradiating step and the second irradiating step is not limited, and they may be carried out simultaneously.

The conditions of the laser welding may be adjusted in taking into consideration the reduction of damage to the gas-permeable membrane 6. For example, the conditions can be adjusted as follows: laser power of 10 to 300 W (or 20 to 50 W); laser wavelength of 600 to 1100 nm (or 800 to 950 nm); and welding time of 0.05 to 5.0 seconds (or 0.1 to 1.5 seconds). The type of the laser is not particularly limited. A gas laser such as a $CO_2$ laser or an excimer laser may be used. A solid-state laser such as a YAG laser (yttrium aluminum garnet laser) also may be used.

Figure 5A:
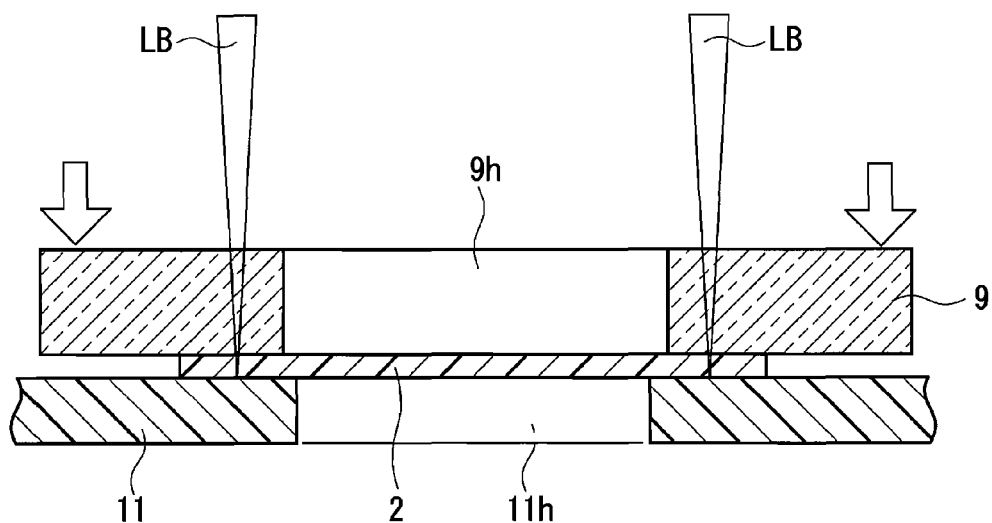
FIGS. 5A to 5C are diagrams showing another manufacturing procedure of the vent structure shown in FIG. 2.
Figure 5B:
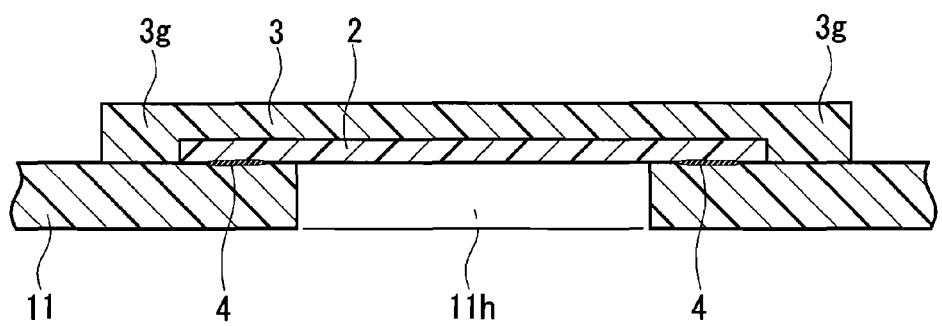
Figure 5C:
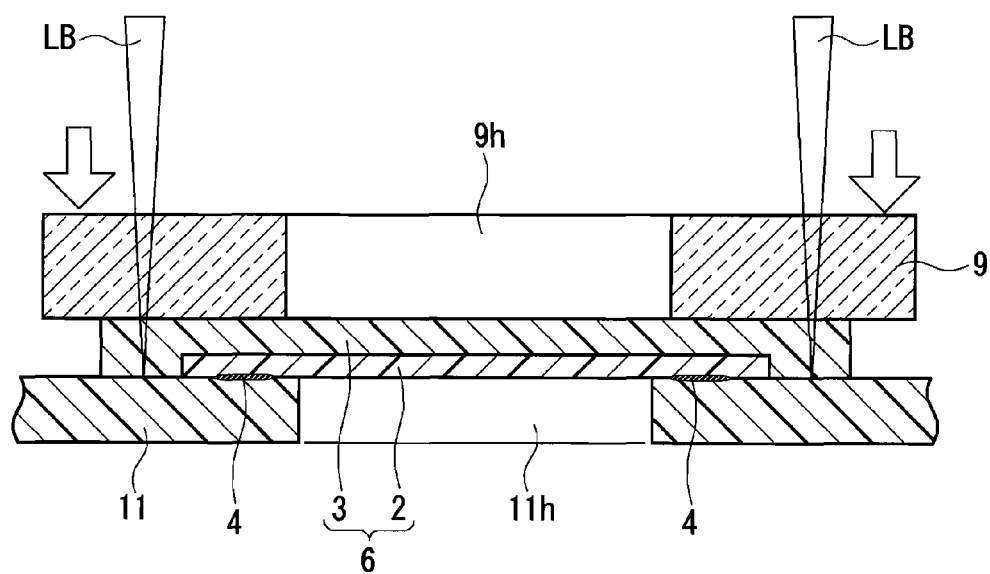

The vent structure 13 also may be manufactured in the order shown in FIGS. 5A to 5C. Specifically, the step of placing the gas-permeable membrane 6 on the opening portion 11h of the first housing component 11 is divided into: a first placing step of placing the main body 2 of the gas-permeable membrane 6 on the opening portion 11h of the first housing component 11; and a second placing step of placing the porous resin sheet 3 on the opening portion 11h of the first housing component 11 to cover the main body 2. More specifically, the first placing step, the first irradiating step of forming the inner periphery welding portion 4 (FIG. 5A), the second placing step (FIG. 5B), and the second irradiating step of forming the outer periphery welding portion 14 (FIG. 5C) are carried out in this order. According to this order, the main body 2 and the porous resin sheet 3 can be positioned individually with respect to the first housing component 11. Therefore, the positioning accuracy is improved. In addition, the manufacture of the vent structure is automated easily.

(Modification)

Figure 6:
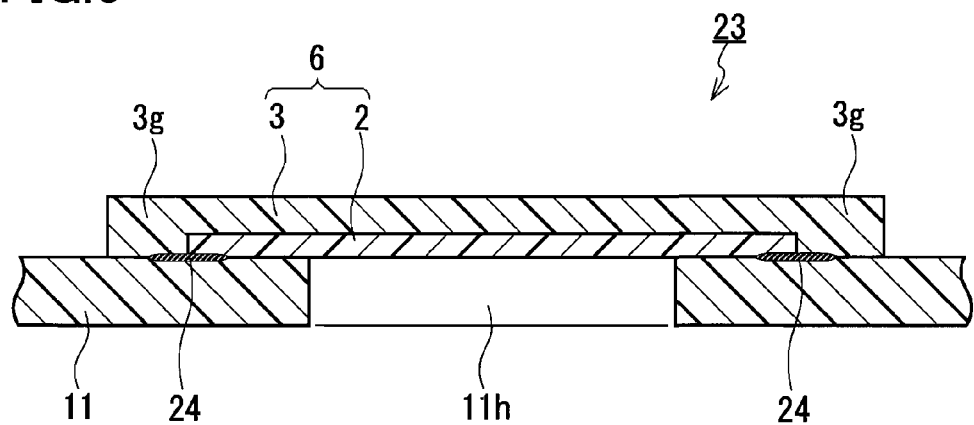
FIG. 6 is a cross-sectional view of a modified vent structure according to the first embodiment.

A vent structure 23 shown in FIG. 6 also achieves the same advantageous effects as the vent structure 13 shown in FIG. 2 does. Specifically, in the vent structure 23, a laser welding portion 24 is formed to straddle the boundary between the main body 2 and the porous resin sheet 3 in the in-plane direction. The laser welding portion 24 has a ring shape in a plan view, and is formed along the outer edge of the main body 2.

Second Embodiment

Figure 7:
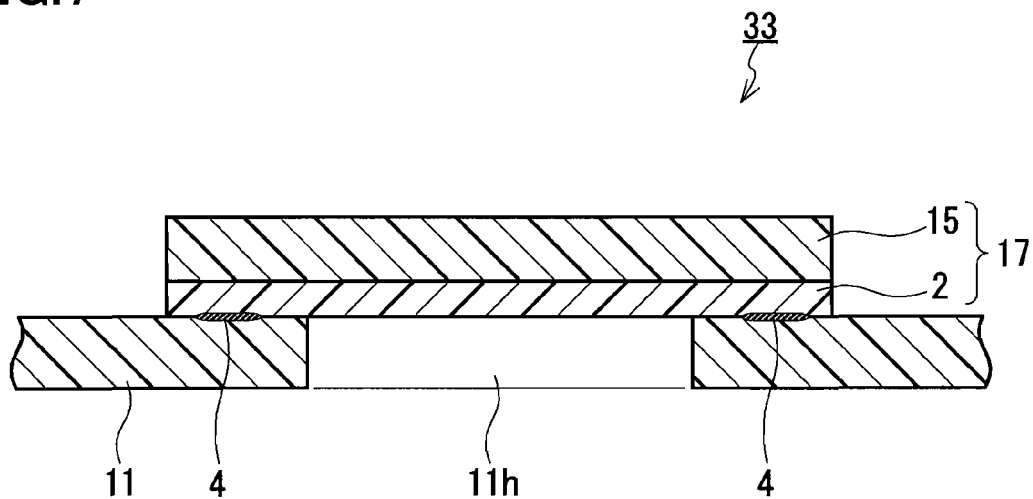
FIG. 7 is a cross-sectional view of a vent structure according to the second embodiment.

As shown in FIG. 7, a gas-permeable membrane 17 used in a vent structure 33 of the present embodiment has the main body 2 including the fluororesin film 2a; and a porous resin sheet 15 provided on one side of the main body 2. The porous resin sheet 15 and the main body 2 have the same area. The porous resin sheet 15 is made of the same material and has the same properties as those of the porous resin sheet described in the first embodiment. The laser welding 4 is formed between the first housing component 11 and the main body 2.

Figure 8:
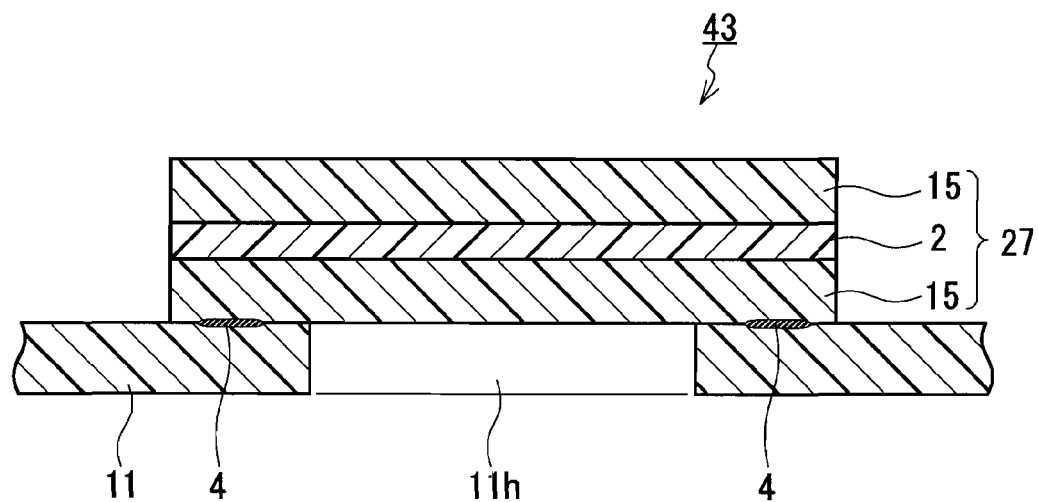
FIG. 8 is a cross-sectional view of another vent structure according to the second embodiment.

A gas-permeable membrane 27 used in a vent structure 43 shown in FIG. 8 is provided with the porous resin sheets 15 on both sides of the main body 2. In the gas-permeable membranes 17 and 27, the main body 2 and the porous resin sheets 15 are integrated by heat lamination. Therefore, they are handled easily when the laser welding step is carried out.

Next, the manufacturing method of the vent structure shown in FIG. 7 will be described below.

Figure 9A:
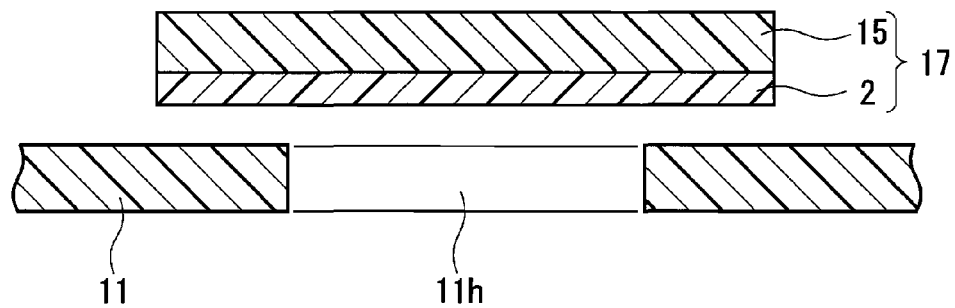
FIGS. 9A to 9C are diagrams showing a manufacturing procedure of the vent structure shown in FIG. 7.
Figure 9B:
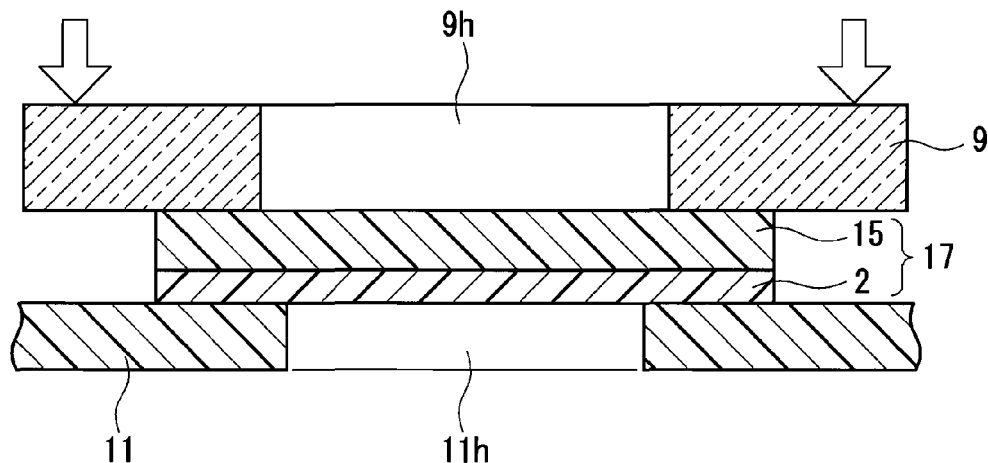
Figure 9C:
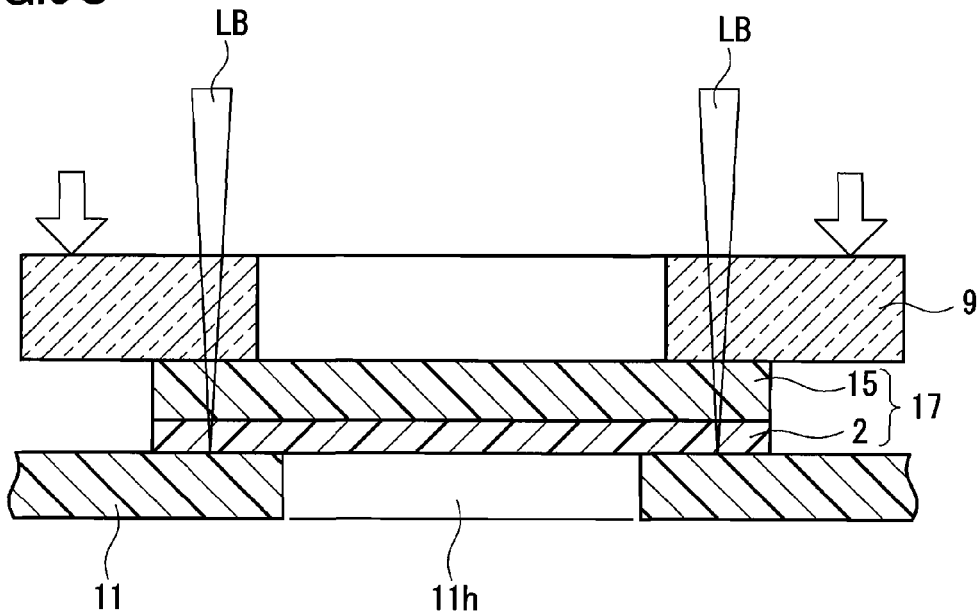

As shown in FIG. 9A, the gas-permeable membrane 17 is placed on the opening portion 11h of the first housing component 11. As shown in FIG. 9B, the gas-permeable membrane 17 is pressed with the light-transmissive jig 9 so that the gas-permeable membrane 17 is brought into close contact with the first housing component 11. As shown in FIG. 9C, the interface between the first housing component 11 and the gas-permeable membrane 17 is irradiated with a laser beam LB so that the laser welding portion 4 is formed around the opening portion 11h. This procedure is performed in the same manner as described in the first embodiment.

EXAMPLES

In order to ascertain the effects of the present invention, the following samples were prepared and subjected to the performance test (high-pressure car wash test).

(Sample 1)

A vent structure shown in FIG. 2 was produced. First, a main body (TEMISH (registered trademark) NTF2131A-S06, manufactured by Nitto Denko Corporation: thickness of 0.2 mm; φ10 mm) and a porous resin sheet (SUNMAP (registered trademark) LC-T, manufactured by Nitto Denko Corporation: thickness of 1.0 mm; φ13 mm) were prepared. These main body and porous resin sheet were laser-welded to a black housing component made of polybutylene terephthalate by the method described with reference to FIGS. 4A to 4C.

(Sample 2)

A vent structure shown in FIG. 7 was produced. First, the main body used in Sample 1 and a porous resin sheet (SUNMAP (registered trademark) LC-T, manufactured by Nitto Denko Corporation: thickness of 1.0 mm; φ10 mm) were laminated by heat lamination to obtain a gas-permeable membrane. Next, this gas-permeable membrane was laser-welded to the housing component used in Sample 1 by the method described with reference to FIG. 9.

(Sample 3)

A gas-permeable membrane (TEMISH (registered trademark) NTF2131A-S06, manufactured by Nitto Denko Corporation: thickness of 0.2 mm; φ10 mm) was laser-welded directly to a black housing component made of polybutylene terephthalate.

<<High-Pressure Car Wash Test>>

Figure 10:
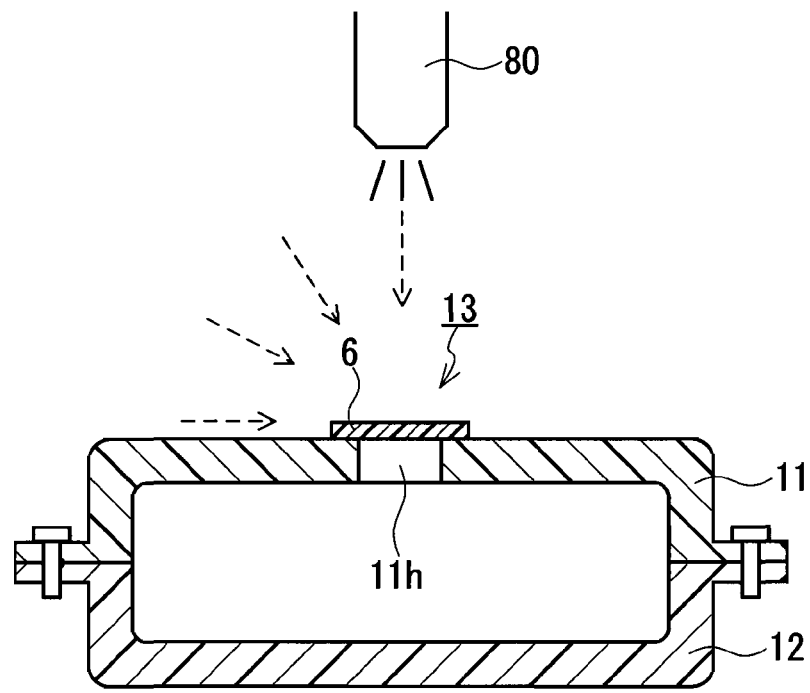
FIG. 10 is a diagram illustrating a water resistance test method.

A high-pressure car wash test was performed on the vent structures of Samples 1 to 3. A high-pressure car wash test is a test in which, as shown in FIG. 10, water is sprayed at each of the vent structures from a nozzle 80 while adjusting the angle of the nozzle to 0°, 30°, 60°, and 90° respectively with respect to the vent structure so as to determine whether water entered the housing or not. The conditions of water injection from the nozzle 80 were as follows:

Injection pressure: 8 MPa
Water temperature: 80° C.
Time: 30 seconds at one angle (about 120 seconds in total)
Flow rate: 14 liter/min <<Result>>

No water entered the housings of Samples 1 and 2 even after they underwent the high-pressure car wash test. On the other hand, a little water entered the housing of Sample 3.

The present invention can be applied to automobile components such as lamps, motors, sensors, switches, ECUs, and gear boxes. In addition to such automobile components, the present invention also can be applied to electric appliances such as mobile communication devices, cameras, electric shavers, electric toothbrushes, and washing machines (for example, humidity sensors).

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A vent structure comprising:
a resin component having an opening portion for ventilation;
a gas-permeable membrane that is attached to the resin component to close the opening portion, the gas-permeable membrane having: a main body including a fluororesin film and a reinforcing member laminated with the fluororesin film by welding or bonding; and a porous resin sheet that is laid on the main body; and
a laser welding portion that is formed around the opening portion to lie between the resin component and the gas-permeable membrane and that joins the resin component with the gas-permeable membrane,
wherein the reinforcing member comprises a woven fabric, a nonwoven fabric, a net, or a mesh, the porous resin sheet is located on a surface side of the vent structure, when the gas-permeable membrane is viewed in a plane, an area of the porous resin sheet is larger than an area of the main body and the main body is fitted entirely in the porous resin sheet, the porous resin sheet has an outer peripheral portion that projects outwardly from an outer peripheral edge of the main body in an in-plane direction perpendicular to the thickness direction of the gas-permeable membrane, both of the main body and the outer peripheral portion of the porous resin sheet are fixed directly to a first portion of the surface of the resin component and a second portion of a surface of the resin component respectively by the laser welding portion, and the first portion is different from the second portion, and a thickness of the porous resin sheet is greater than that of the main body.

2. The vent structure according to claim 1, wherein the porous resin sheet is an ultra-high molecular weight polyethylene porous sheet.

3. The vent structure according to claim 1, wherein the resin component is a molded article of a resin having a lower melting point than a fluororesin that constitutes the fluororesin film.

4. The vent structure according to claim 1, wherein the laser welding portion has a double ring shape in a plan view.

5. The vent structure according to claim 4, wherein the porous resin sheet is provided on only one side of the main body, and the laser welding portion includes: an inner periphery welding portion that is formed between the resin component and the main body; and an outer periphery welding portion that is formed between the resin component and the outer peripheral portion of the porous resin sheet.

6. The vent structure according to claim 1, wherein the laser welding portion is formed so as to straddle a boundary between the main body and the porous resin sheet in the in-plane direction.

7. The vent structure according to claim 1, wherein the porous resin sheet comprises a recess facing the opening portion, and the main body is fitted in the recess.

8. The vent structure according to claim 1, wherein the reinforcing member of the main body is welded to the resin component.

9. The vent structure according to claim 1, wherein the first portion of the surface of the surface of the resin component and the second portion of the surface of the resin component are on a same plane.

10. A method of manufacturing a vent structure including: a resin component having an opening portion for ventilation; and a gas-permeable membrane that is attached to the resin component to close the opening portion, wherein the gas-permeable membrane has: a main body including a fluororesin film and a reinforcing member laminated with the fluororesin film by welding or bonding; and a porous resin sheet that is laid on the main body, the method comprising the steps of:

placing the gas-permeable membrane on the opening portion of the resin component so that the porous resin sheet is located on a surface side of the vent structure to be manufactured; and irradiating an interface between the resin component and the gas-permeable membrane with a laser beam so that a laser welding portion is formed around the opening portion to fix directly, to the resin component, both of the main body and an outer peripheral portion of the porous resin sheet that projects outwardly from an outer peripheral edge of the main body in an in-plane direction perpendicular to a thickness direction of the gas-permeable membrane, wherein the reinforcing member comprises a woven fabric, a nonwoven fabric, a net, or a mesh, when the gas-permeable membrane is viewed in a plane, an area of the porous resin sheet is larger than an area of the main body and the main body is fitted entirely in the porous resin sheet, in the irradiating step, both of the main body and the outer peripheral portion of the porous resin sheet are fixed directly to a first portion of a surface of the resin component and a second portion of the surface of the resin component respectively by the laser welding portion and the first portion is different from the second portion, and a thickness of the porous resin sheet is greater than that of the main body.

11. The method of manufacturing a vent structure according to claim 10, wherein in the placing step, a light-transmissive jig having an opening portion for heat radiation is used as a jig for maintaining a positional relationship between the gas-permeable membrane and the resin component, and the gas-permeable membrane is sandwiched between the light-transmissive jig and the resin component so that the gas-permeable membrane is exposed through the opening portion of the light-transmissive jig, and in the laser irradiating step, the gas-permeable membrane and the resin component are irradiated with the laser beam that has passed through the light-transmissive jig.

12. The method of manufacturing a vent structure according to claim 10, wherein the porous resin sheet is an ultra-high molecular weight polyethylene porous sheet.

13. The method of manufacturing a vent structure according to claim 10, wherein the porous resin sheet is provided on only one side of the main body, and the laser irradiating step comprises: a first irradiating step of forming an inner periphery welding portion as the laser welding portion between the resin component and the main body; and a second irradiating step of forming an outer periphery welding portion as the laser welding portion between the resin component and the outer peripheral portion of the porous resin sheet.

14. The method of manufacturing a vent structure according to claim 10, wherein in the laser irradiating step, the laser welding portion is formed so as to straddle a boundary between the main body and the porous resin sheet in the in-plane direction.

15. The method of manufacturing a vent structure according to claim 10, wherein the porous resin sheet comprises a recess facing the opening portion, and the main body is fitted in the recess.

16. The method of manufacturing a vent structure according to claim 10, wherein the reinforcing member of the main body is welded to the resin component.

17. The method of manufacturing a vent structure according to claim 10, wherein the first portion of the surface of the resin component and the second portion of the surface of the resin component are on a same plane.

18. A vent structure comprising:
a resin component having an opening portion for ventilation;

a gas-permeable membrane that is attached to the resin component to close the opening portion, the gas-permeable membrane having: a main body including a fluororesin film; and a porous resin sheet that is laid on the main body; and a laser welding portion that is formed around the opening portion to lie between the resin component and the gas-permeable membrane and that joins the resin component with the gas-permeable membrane, wherein the porous resin sheet is located on a surface side of the vent structure, when the gas-permeable membrane is viewed in a plane, an area of the porous resin sheet is larger than an area of the main body and the main body is fitted entirely in the porous resin sheet, the porous resin sheet has an outer peripheral portion that projects outwardly from an outer peripheral edge of the main body in an in-plane direction perpendicular to a thickness direction of the gas-permeable membrane, both of the main body and the outer peripheral portion of the porous resin sheet are fixed directly to a first portion of the surface of the resin component and a second portion of the surface of the resin component respectively by the laser welding portion, and the first portion is different from the second portion, the first portion of the surface of the resin component and the second portion of the surface of the resin component are on a same plane, and a thickness of the porous resin sheet is greater than that of the main body.

* * * * *